US007299172B2

(12) United States Patent
Wong

(10) Patent No.: US 7,299,172 B2
(45) Date of Patent: Nov. 20, 2007

(54) SYSTEMS AND METHODS FOR SOUND COMPRESSION

(75) Inventor: Jerome D. Wong, Sunnyvale, CA (US)

(73) Assignee: J.W. Associates, Sunnyvale, CA (US)

( * ) Notice: Subject to any disclaimer, the term of this patent is extended or adjusted under 35 U.S.C. 154(b) by 0 days.

(21) Appl. No.: 10/961,264

(22) Filed: Oct. 7, 2004

(65) Prior Publication Data

US 2005/0080618 A1    Apr. 14, 2005

Related U.S. Application Data

(60) Provisional application No. 60/510,070, filed on Oct. 8, 2003.

(51) Int. Cl.
*G10L 19/00* (2006.01)
(52) U.S. Cl. ............... 704/212; 704/229; 704/230
(58) Field of Classification Search ........ 704/212, 704/219, 200.1, 213, 207, 208, 209, 226, 704/229, 230
See application file for complete search history.

(56) References Cited

U.S. PATENT DOCUMENTS

| | | | |
|---|---|---|---|
| 4,303,803 A | | 12/1981 | Yatsuzuka |
| 4,519,073 A | * | 5/1985 | Bertocci et al. ............ 370/477 |
| 5,083,310 A | * | 1/1992 | Drory ........................ 704/212 |
| 5,206,884 A | * | 4/1993 | Bhaskar .................... 375/254 |
| 5,402,124 A | * | 3/1995 | Todd et al. ................ 341/131 |
| 5,632,003 A | * | 5/1997 | Davidson et al. ........ 704/200.1 |
| 6,104,991 A | * | 8/2000 | Newland et al. ........... 704/212 |
| 2001/0040927 A1 | * | 11/2001 | Chu .......................... 375/254 |

OTHER PUBLICATIONS

Liu et al., Power Spectra of ADPCM, Fegruary 1977, IEEE Transactions on Acoustics, Speech, and Signal Processing, vol. ASSP-25, No. 1, pp. 56-62.□□*
Zhang et al., An Efficient Embedded ADPCM Coder, Mar. 26-29, 1995, Telecommunications Conference Publication, No. 404, pp. 210-214.*
Chu et al., Subband ADPCM Coding for Wideband Audio Signals using Analysis-by-Synthesis Quantization Scheme, Apr. 13-16, 1994, International Symposium on Speech, Image Processing, and Neural Netorks, pp. 464-467.*
Sherif, Overview and Perfomance of CCITT/ANSI Embedded ADPCM Algorithms, Feb. 1993, IEEE Transactions on Communications, vol. 41, No. 2, 391-399.*
International Search Report, mailed May 20, 2005. 5 pages.
Written Opinion of the International Searching Authority, mailed May 20, 2005. 3 pages.

* cited by examiner

*Primary Examiner*—Tālivaldis Ivars Šmits
*Assistant Examiner*—Thomas E. Shortledge
(74) *Attorney, Agent, or Firm*—Blakely, Sokoloff, Taylor & Zafman LLP

(57) ABSTRACT

Embodiments of the invention achieve increased compression of audio data in comparison to prior art ADPCM compression schemes using modest processing power and resources. For one embodiment, an asymmetric ADPCM encoding scheme is implemented to increase apparent encoding resolution for a specified number of encoding bits. Additionally, or alternatively, such techniques as pattern recognition and encoding, as well as calculation simplification, are employed to increase data compression of audio data.

21 Claims, 10 Drawing Sheets

Some possible Asymmetries for a 3-bit system.

SYSTEMS AND METHODS FOR SOUND COMPRESSION

CLAIM OF PRIORITY

This application is related to, and hereby claims the benefit of provisional application No. 60/510,070 which was filed Oct. 8, 2003.

COPYRIGHT NOTICE/PERMISSION

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright© 2003, J W Associates, All Rights Reserved.

FIELD

Embodiments of the invention relate generally to the field of audio data compression and more specifically to methods and apparatuses for increased compression of audio data for use in microprocessors having low processing power.

BACKGROUND

The greater the amount of audio data compression, the greater the duration of sound a given microcontroller is able store, therefore, many attempts have been made over the past several decades to improve the compression of audio data for use in microcontrollers having limited processing power and storage capabilities. However, typical audio data compression schemes that reduce distortion to acceptable levels require processing power in excess of that available in many low-cost products.

A typical audio data compression technique, adaptive differential pulse code modulation (ADPCM), is derived from a pulse code modulation (PCM) scheme in which an analog signal (signal) amplitude is sampled at regular intervals. ADPCM is a reduced bit-rate variant of PCM audio encoding.

With PCM, the sampling rate is typically several times the highest frequency of the signal. The amplitude of the signal at each sample is quantized (i.e., rounded off to the nearest of several specific and predetermined levels). The levels are represented by a number of counts, so the output of a PCM compression scheme is a series of binary numbers constituting a digital signal.

An ADPCM compression scheme produces a digital signal with a lower bit rate than PCM by encoding only the difference between samples (delta value) and adjusting the encoding scale dynamically to accommodate variation in the magnitude of the sample difference. ADPCM, though not difficult to implement, introduces a high level of noise. Typically, an ADPCM system is a band compression system in which the prediction of signal amplitude at present, is based upon a previous sample or samples. The basis for such a prediction scheme is that for many instances of audio data (e.g., speech signals), the proximate samples are highly correlated.

ADPCM achieves bit rate reduction through the use of adaptive prediction and adaptive quantization. ADPCM sampling is typically performed at 8 KHz with 3 or 4 bits used to describe the difference between adjacent samples. A typical ADPCM scheme can achieve a 2:1 compression ratio by representing an 8-bit signal through encoded 4-bit delta values with reasonable quality.

ADPCM uses variable gain depending upon the variation in amplitude (motion) of the signal. That is, ADPCM is effected based upon an assumption that the signal will have periods of small amplitude and periods of large amplitude; this is typical of speech and many other audio signals. Encoding the deltas as 4-bit values means that only 4 bits are stored to memory regardless of whether the 4 bits pertain to a high-amplitude portion of the signal or a low-amplitude portion of the signal. Using 4 bits provides sixteen resolution levels that may be represented as eight positive levels and seven negative levels (or vice versa), together with a zero level. An alternative representation may be seven positive levels and seven negative levels with two zero levels, one of which may not be used.

When a typical ADPCM scheme is employed to encode an 8-bit signal through encoded 3-bit delta values (i.e., a compression ratio of approximately 2.6:1), an unacceptable amount of distortion to the original signal results. A 3-bit encoding provides only eight resolution levels that may be represented as four positive levels and three negative levels (or vice versa), together with a zero level. Again an alternative representation may be three positive levels and three negative levels with two zero levels, one of which may not be used. While having four resolution levels provides an acceptable level of quality for many applications, three resolution levels does not. This means a 3-bit encoding scheme (2.6:1 compression) is undesirable for many applications, thus limiting the duration of sound that a given microcontroller is able store.

Of course, with a greater amount of processing power and memory resources, other sophisticated methods and systems can be employed (e.g., CELP) that achieve greater compression ratios for audio data, while limiting distortion to acceptable levels. These systems are not practical for many applications employing microprocessors with limited processing capabilities.

BRIEF DESCRIPTION OF THE DRAWINGS

The invention may be best understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Embodiments of the invention provide an improved ADPCM encoding scheme that employs four processes that may be used separately or in conjunction with one another in various alternative embodiments. One embodiment of the invention includes using 3-bit encoding within the context of an asymmetric ADPCM audio data compression scheme.

Included as Appendix A is an exemplary source code for compressing and decompressing audio data in accordance with one embodiment of the invention.

Asymmetric ADPCM

In accordance with one embodiment of the invention, asymmetric ADPCM is employed to increase effective resolution for a specified number of encoding bits. That is, for a 3-bit encoding scheme, the resolution levels may be represented as four positive levels and three negative levels, together with a zero level. If encoding can be skewed so that most of the encoding is done with four resolution levels (i.e., instead of three), then the distortion typically resulting with a 3-bit encoding is reduced. The asymmetry creates a high-resolution side (e.g., positive side) and a low-resolution side (e.g., negative side). By accurately predicting the sign of the next delta value, it is possible to ensure that encoding takes place more often on the high-resolution side. By tracking the predominant frequency of the signal together with the previous delta value it is possible to predict the characteristics of the signal fairly accurately. This allows for adjustment of the asymmetry to skew the ADPCM coefficients so that encoding is more likely to take place with higher resolution.

Figure 1:
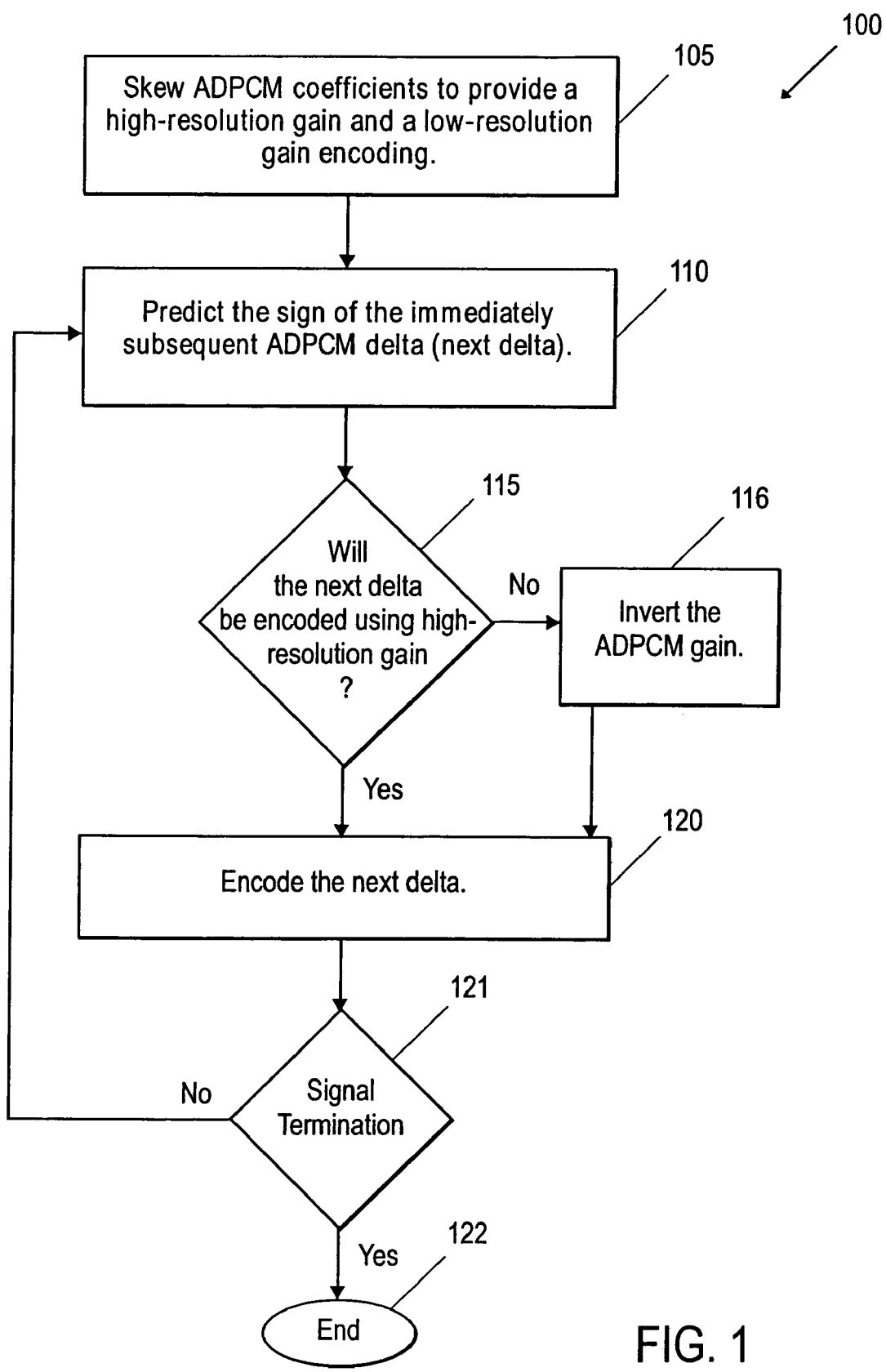
FIG. 1 illustrates a process by which ADPCM deltas are encoded with high-resolution gain in accordance with one embodiment of the invention.

FIG. 1 illustrates a process by which ADPCM deltas are encoded with high-resolution gain in accordance with one embodiment of the invention. Process 100, shown in FIG. 1, begins at operation 105 in which ADPCM coefficients are skewed in order to provide a high resolution gain encoding and low resolution gain encoding. For example, for a 3-bit encoding scheme, the ADPCM coefficients could be skewed to provide 4 positive levels, a zero level, and 3 negative levels. For an alternative embodiment, the coefficients may be skewed further (e.g., 5 positive levels, a zero level, and 2 negative levels).

At operation 110, the sign of the immediately subsequent ADPCM delta value (next delta value) is predicted. The prediction may be done in many ways based on various indicators. For example, because the derivative of the input signal curve is usually continuous, a positive delta value is usually followed by another positive delta value, and a positive delta value followed by a zero delta value is usually followed by a negative delta. These and other such indicators can be used to make fairly accurate predictions regarding the sign of the subsequent delta value for typical signals.

At operation 115, a determination is made as to whether the next delta value, as predicted, will be encoded using the high-resolution gain. If so, the next delta value is encoded at operation 120 using the high resolution encoding. That is, for example, if the predicted value for the next delta value is positive and the ADPCM coefficients have been skewed to provide high resolution for positive values, then the next delta value is encoded using the high-resolution gain.

At operation 115, if the next delta value, as predicted, would not be encoded using the high-resolution gain, then the ADPCM gain is inverted at operation 116. Operation 116 provides high-resolution gain in accordance with the predicted sign of the next delta. That is, for example, if the predicted value for the next delta value is negative and the ADPCM coefficients have been skewed to provide high resolution for positive values, then the ADPCM coefficients are inverted thus providing high resolution for negative values. After the ADPCM gain is inverted, the next delta value is encoded using the high-resolution gain at operation 120.

At operation 121, if the signal has not ended, the process continues by repeatedly predicting the next delta. At operation 122, the process terminates upon termination of the signal.

The greater the skewing, the better resolution for encoding the next delta value will be, provided the prediction of the next delta value is accurate. Less skewing provides greater resolution for erroneously predicted next deltas. There are also other compensations for erroneously predicted next delta values. For example, a positive delta value, followed by a negative delta value, followed by a positive delta value indicates a high frequency signal (near the Nyquist frequency), again, because the input signal curve is usually continuous. This type of signal, which could lead to an erroneous prediction, is rare in normal speech, and is in an area of the audio spectrum to which the human ear is typically not very sensitive. Such signals can be accounted for by sufficiently increasing the gain to cover the signal.

Variable Asymmetry

In accordance with one embodiment of the invention, the ADPCM coefficients are skewed in order to provide a high-resolution gain and low resolution gain encoding as described above in reference to operation 105 of FIG. 1. Empirically, it is determined that the extent of asymmetry that provides the most accurate modeling, and hence, the most accurate and efficient encoding is dependent upon the frequency of the signal being encoded. For example, a high frequency signal (i.e., having a high frequency relative to the Nyquist frequency) produces abrupt changes in the deltas. If the signal value is increasing for one sample, it is likely to be decreasing at the next sample. This results in more accurate results for high frequency signals being obtained with greater asymmetry. For one embodiment of the invention, the frequency of the signal is determined and the asymmetry is adjusted based upon the frequency.

Figure 2:
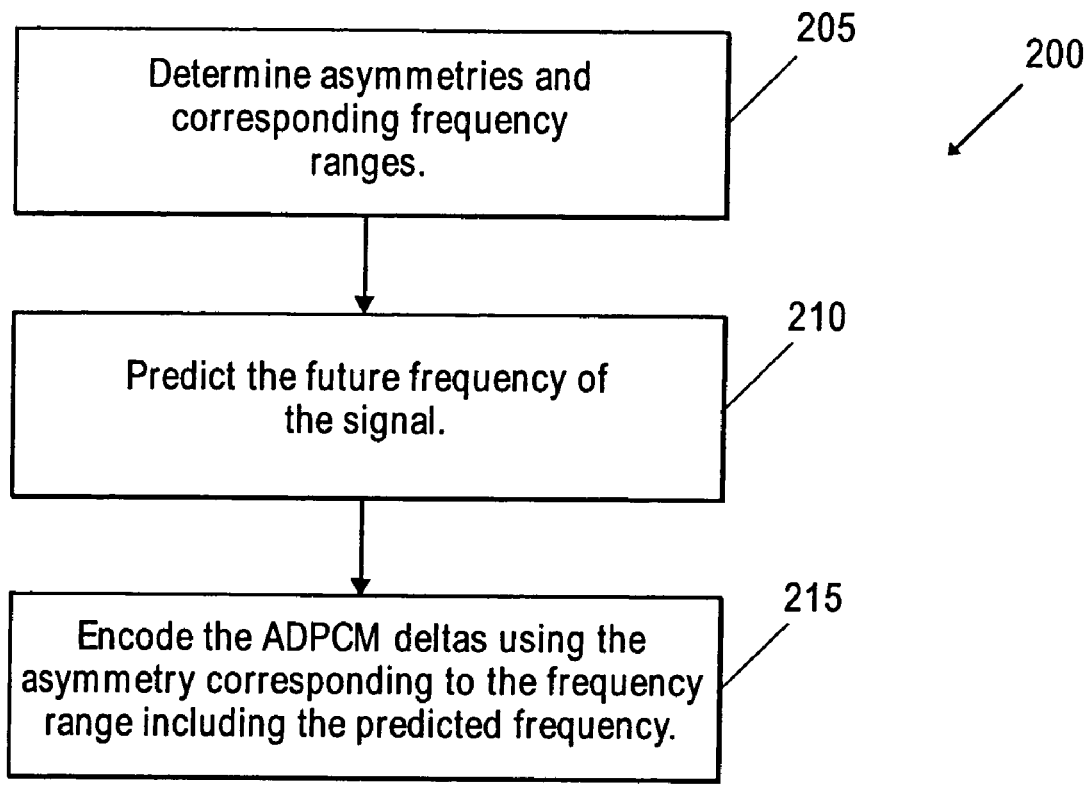
FIG. 2 illustrates a process by which the asymmetry for an asymmetrical ADPCM encoding scheme is implemented in accordance with one embodiment of the invention.
Figure 3:
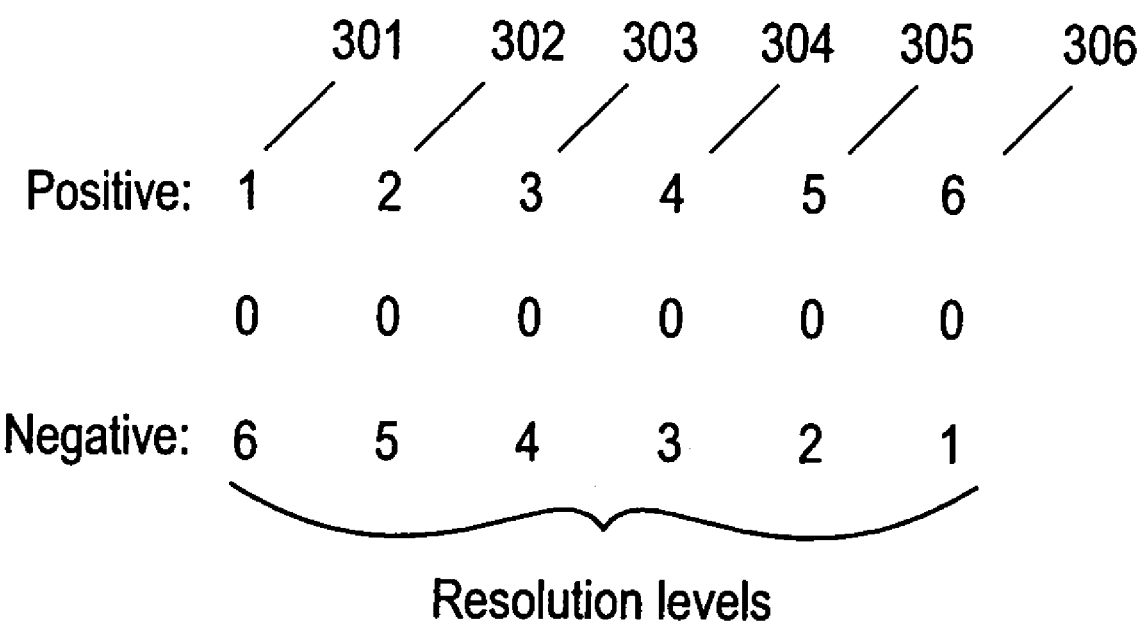
FIG. 3 illustrates some possible asymmetries for a 3-bit encoding system.

FIG. 2 illustrates a process by which the asymmetry for an asymmetrical ADPCM encoding scheme is implemented in accordance with one embodiment of the invention. Process 200, shown in FIG. 2, begins at operation 205, in which a number of possible asymmetries corresponding to various frequencies, are determined. FIG. 3 illustrates some possible asymmetries for a 3-bit encoding system. Asymmetry 301 is an example of an extreme negative asymmetry, asymmetry 302 is an example of a moderate negative asymmetry, asymmetries 303 and 304 are examples of minimal asymmetry (negative and positive, respectively), asymmetry 305 is an example of a moderate positive asymmetry, and asymmetry 306 is an example of an extreme positive asymmetry. For each of a number of asymmetries, a corresponding frequency range within the frequency range of the signal is determined. For example, for a signal with a sampling frequency of 8 kHz, the relatively high frequency range of 3.5-4.0 kHz may correspond to the extreme negative asymmetry (e.g., 1 positive resolution level, a zero resolution level, and 6 negative resolution levels). Likewise, a relatively lower frequency (e.g., 1-2 kHz) may correspond to the least asymmetry (e.g., 4 positive resolution level, a zero resolution level, and 3 negative resolution levels).

At operation 210, the frequency of the signal is predicted. The frequency may be determined in a number of ways of varying complexity (e.g., using the predominant frequency and previous delta value). The simplest being to determine the frequency, and because the frequency does not typically change often or dramatically, use the determined frequency as the predicted frequency.

At operation 215, deltas are encoded using the asymmetry corresponding to the frequency range, including the predicted frequency.

Figure 2A:
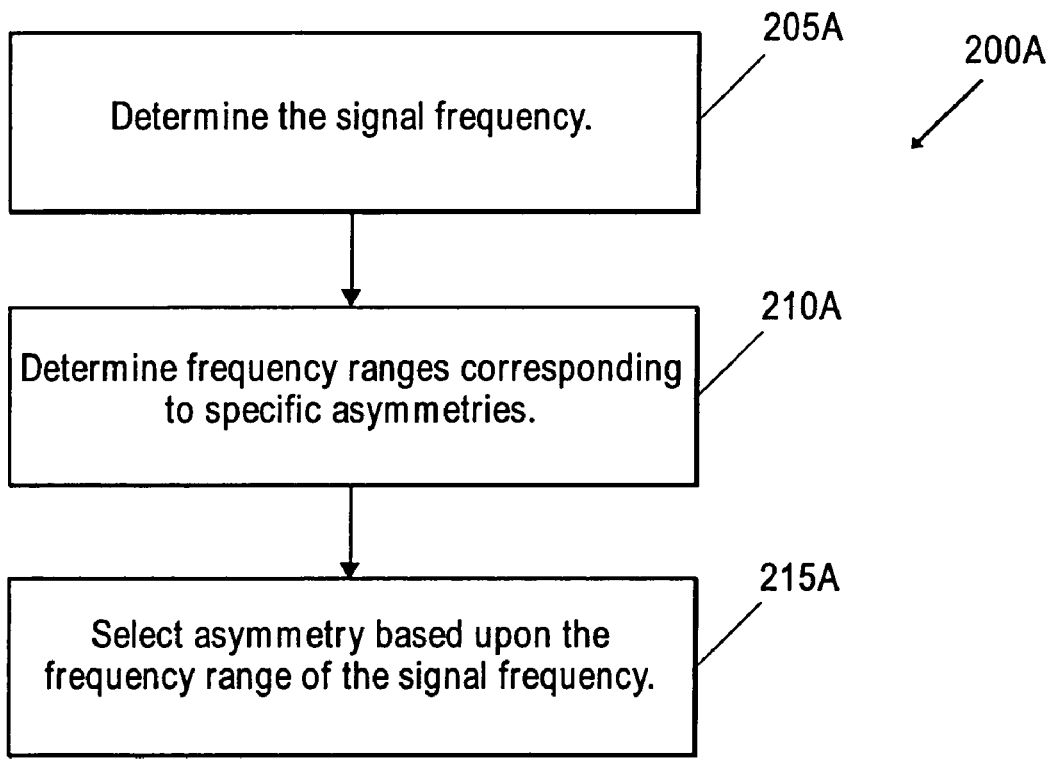
FIG. 2A illustrates a process by which the asymmetry is selected based upon the frequency in accordance with one embodiment of the invention.

FIG. 2A illustrates a process by which the asymmetry is selected based upon the frequency in accordance with one embodiment of the invention. Process 200A, shown in FIG. 2A, begins at operation 205A in which the signal frequency is determined. The signal frequency may be determined by counting and averaging zero crossings for one embodiment. For example, a relatively small number of zero crossings indicates a slow moving curve (low frequency signal), while a relatively large number of zero crossings indicates a high frequency signal.

At operation 210A, a number of frequency ranges are determined corresponding to specified asymmetries. For example, the frequency ranges, which are relative to the Nyquist frequency of the signal, may include "very low," "low," "moderate," "high," and "very high".

At operation 215A, the asymmetry is selected based upon which frequency range the determined frequency is in. For example, for a very low frequency range an extreme positive asymmetry (e.g., asymmetry 306) is used, for a low frequency range a moderate positive asymmetry (e.g., asymmetry 305) is used, for a moderate frequency range a minimal asymmetry (positive or negative) (e.g., asymmetries 303 and 304) is used, for a high frequency range a moderate negative asymmetry (e.g., asymmetry 302) is used, and for a very high frequency range an extreme negative asymmetry (e.g., asymmetry 301) is used.

Calculation Simplification

The calculations typically required for ADPCM encoding can be substantially reduced while maintaining or improving quality.

ADPCM Coefficient Table

In accordance with one embodiment of the invention, implementing a table of simplified, pre-calculated, ADPCM coefficients can substantially reduce the processing resources required to encode the ADPCM deltas, as compared with prior art schemes. For one embodiment, the table contains a limited number of discrete gain values. Such a table obviates the need for the complicated mathematical conversions (e.g., logarithmic/inverse logarithmic, rounding, etc.), while still providing gain values with characteristics approached with more sophisticated math.

A gain value table, in accordance with one embodiment of the invention, may have a finite number of values all of which are of the form $\sqrt[m]{2^n}$. For example, the table may be limited to gain values that are multiples of $\sqrt{2}$. Such limitation greatly reduces binary calculations, thus allowing the system to be implemented with reduced processing requirements.

A gain value table, in accordance with one embodiment of the invention, may include integer values at the lowest gain. Gain can then be selected without the distortion caused by errors inherent in complex calculations and rounding errors. This is especially important at the lowest gain, where an error of even one count may cause audible distortion. For one embodiment, the elementary numbers (0, 1, 2, 3, and 4) are included in the table, and are unique. This allows encoding the smallest and slowest moving signals exactly, and with no waste of duplicating or distortion resulting from missing values that would be typical with prior art calculated ADPCM coefficients.

Limit Table

Additionally, or alternatively, a limit table may be implemented, which allows for the quick and efficient determination of which gain value to apply for a given delta. The limit table predefines which gain value (e.g., from the gain value table) will be applied for each of the possible deltas. For example, for one embodiment, an average of two consecutive gain values may be determined and deltas below the average value would result in the lower of the two consecutive gain values being used while values at, or above the average value, would result in the higher of the two consecutive gain values being used.

Moreover, by weighting the limits to favor maintaining the gain, the quantization distortion on large signals can be further reduced. The result of such weighting is that a single value error is realized instead of a series of quantization errors. For example, if the limit for the highest gain value is weighted so that the highest gain value has less chance of being selected, a better noise ratio is obtained. The reason for this is that when the gain is increased quickly, several future samples are encoded with the corresponding reduced resolution. On the other hand, if an error is accepted on a single sample, several future samples can be encoded more accurately. In terms of sound quality, a relatively large error on a single sample is preferable to multiple, relatively smaller errors.

Figure 4:
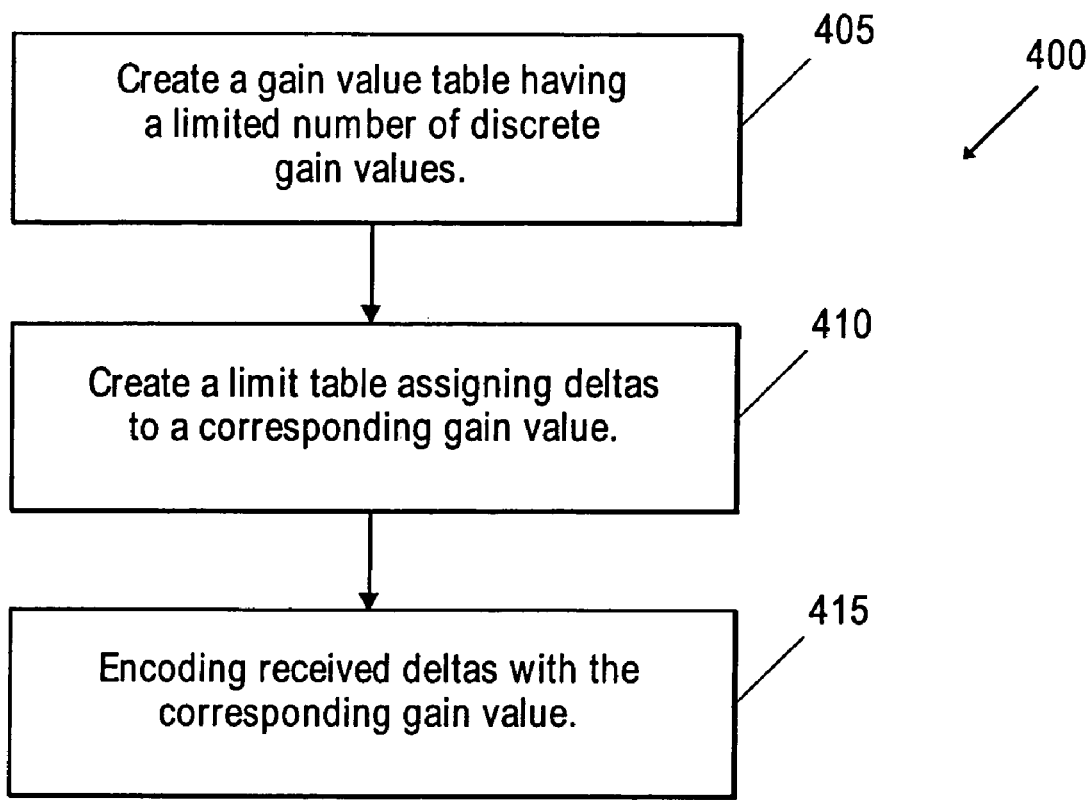
FIG. 4 illustrates a process by which an ADPCM gain value is selected in accordance with one embodiment of the present invention.

FIG. 4 illustrates a process by which an ADPCM gain value is selected in accordance with one embodiment of the present invention. Process 400, shown in FIG. 4, begins at operation 405, in which a gain value table is created. The gain value table includes a limited number of discrete gain values. As described above, for alternative embodiments, such a table may include values chosen to reduce calculation complexity (e.g., values, all of which are of the form $^m\sqrt{2^n}$), or to reduce the distortion of small signals (elementary numbers for lowest gain).

At operation 410, a limit table is created that assigns each delta value to a corresponding gain of the gain value table. As described above, for alternative embodiments, the table may implement an averaging scheme as the basis for assignment, or may use some other basis.

At operation 415, a delta value is received, the corresponding gain value is determined by reference to the limit table, and used to encode the delta.

The use of such limit tables allows the ideal reproduction to be extended into moderately large signals and provide better quality than a simple comparison typically implemented for small systems. Moreover, by reducing any truncation error associated with the realtime calculation, implementation of a limit table provides better quality than the more sophisticated comparisons of typical prior art schemes.

Variable Holdoff

Gain control holdoff is a technique that is employed to maintain a high gain for some period after a large signal has been detected. This is to prevent a quick down-scale in gain that results in applying small gain, while in a high-gain period of the signal. Such down-scaling is likely to lead to greater error. Typically, gain control holdoff suspends a gain adjustment for a specified number of samples after a large signal has been detected. This technique often does not yield optimal results, as the details of a large signal are encoded with an unnecessarily coarse resolution.

In accordance with one embodiment of the invention, a variable gain control holdoff (variable holdoff) scheme is implemented to vary the amount of gain holdoff for different conditions. A variable holdoff scheme allows for the signal curve to be more efficiently traversed. The gain can be changed more quickly, in comparison with prior art schemes, to match the near-term features of superimposed signals. For one embodiment, a set of holdoff values (i.e., number of samples) is determined with each holdoff value corresponding to one or more signal characteristics or delta values. For example, if the previous gain was a positive maximum, the holdoff may be five samples, whereas if the previous gain was a negative maximum, the holdoff may be four samples. Again, the holdoff may be a different value, where gain goes from any value to a negative maximum value. The variable holdoff scheme allows for a fine-tuning and shifting of the encoding errors that results in better quality.

Variable holdoff improves quality for a constant frequency, or relatively slow-moving signal, however at higher frequency, especially approaching the Nyquist frequency, the low frequency holdoff rules may not be appropriate. In such cases, other gain adjustment criteria are employed. For example, when two negative maximums are received consecutively, not only is there a shorter holdoff in decreasing the gain, but the gain is actually increased under these circumstances. Also, for a high frequency signal with increasing amplitude, gain tracks best when it is increased multiple times by smaller increments.

Figure 5:
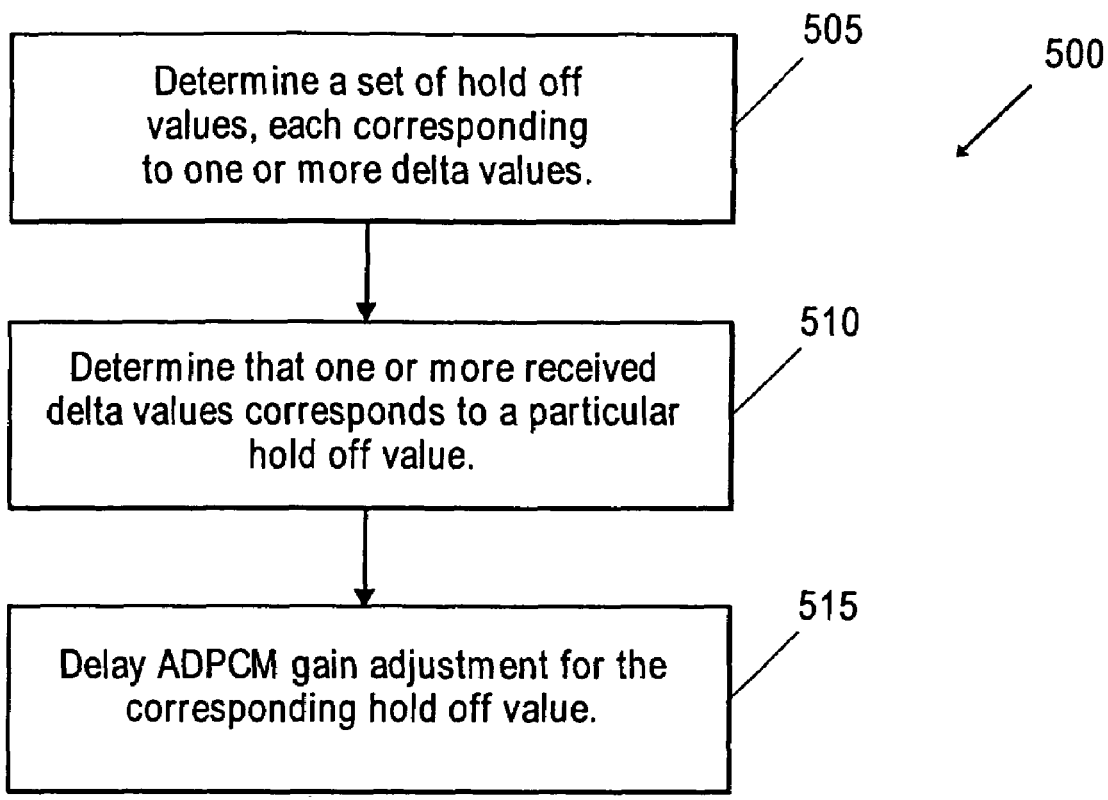
FIG. 5 illustrates a process in which one or more delta values are used to determine a holdoff value for ADPCM gain adjustment in accordance with one embodiment of the invention.

FIG. 5 illustrates a process in which one or more delta values are used to determine a holdoff value for ADPCM gain adjustment in accordance with one embodiment of the invention. Process 500, shown in FIG. 5, begins at operation 505 in which a set of holdoff values are determined. For one embodiment, each holdoff value corresponds to one or more delta values.

At operation 510, received delta values are evaluated to determine that one or more delta values corresponds to a holdoff value.

At operation 515 the ADPCM gain adjustment is delayed for the corresponding holdoff value.

Zero Crossings

The relative motion of a signal curve (i.e., the dominant frequency of the signal) may be determined by the number of zero crossings as discussed above. Low frequency signals have large flat areas with relatively small deltas. For such areas, it is desirable to have the gain scaled down within one cycle in order to capture the nuances of the signal at these points. Then, for steeper portions of the low frequency signal with relatively higher deltas, the gain is scaled up.

In contrast, high frequency signals do not have these large areas with small deltas, and therefore, it is desirable to have the gain remain as constant as possible. In accordance with one embodiment of the invention, the zero crossings are counted and averaged to establish a dominant frequency of the signal. This allows for adjusting the ADPCM gain parameters to capture the full signal without wasted resolution on the top and bottom of the signal. That is, the gain is quickly realized that just covers the signal at higher frequencies.

Figure 6:
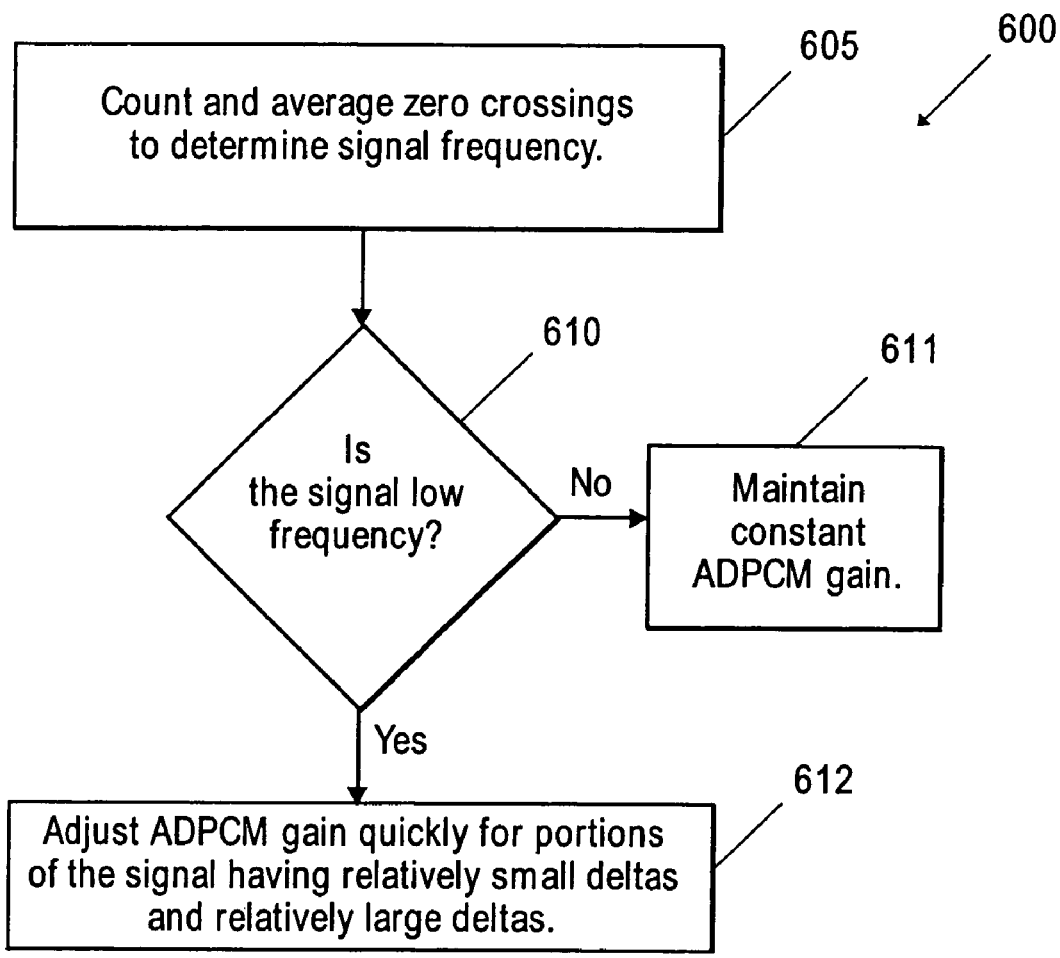
FIG. 6 illustrates a process by which zero crossings are used to adjust ADPCM gain parameters in accordance with one embodiment of the invention.

FIG. 6 illustrates a process by which zero crossings are used to adjust ADPCM gain parameters in accordance with one embodiment of the invention. Process 600, shown in FIG. 6, begins at operation 605 in which the number of zero crossings is counted and averaged to establish a dominant frequency.

At operation 610, a determination is made as to whether the frequency is low frequency or high frequency.

If the frequency is determined to be high frequency, then the ADPCM gain is maintained constant at operation 611.

If the frequency is determined to be low frequency, then the ADPCM gain is adjusted quickly for portions of the signal having relatively small deltas and relatively larger deltas at operation 612.

The averaging of zero crossings can be substituted with an integrator, reducing the memory requirements.

Unstable Coefficients

Typical prior art ADPCM were designed in such a way that the gain remains stable when the predicted value was chosen. Prior art systems encoded the closest value and were not designed to encode otherwise. Empirically it is determined that an unstable system provides a better compression ratio than a stable system. That is, an unstable gain is able to slew faster and is, therefore, more responsive. This responsiveness provides a higher compression ratio, but the gain can become too large providing erroneous encoding. The instability results because following the best prediction drives not only the ideal subsequent value, but also the occasionally non-ideal gain, and the occasionally non-ideal asymmetry (for a system employing asymmetric ADPCM in accordance with an embodiment of the invention). In prior art ADPCM, the gain responsiveness was kept low enough to satisfy good stability.

In accordance with one embodiment of the invention, a system is implemented that takes advantage of the increased responsiveness of an unstable gain and asymmetry, but that also harnesses the instability to avoid excessive erroneous results. For one embodiment of the invention, the gain is allowed to vary rapidly for desired portions of the signal, but then is limited by selecting future values based, not only upon the ideal predicted value, but on the ideal gain as well.

For one embodiment, indications of the future signal characteristics are used to provide more accurate subsequent encoding. This is effected by evaluating one or more future samples to determine the future signal characteristics and including indicators of these characteristics in excess information space in the current sample. These future signal characteristics can be used to stabilize otherwise unstable gain coefficients, thus providing better responsiveness to signal changes. For example, if the gain is becoming too large due to instability, to the point where erroneous values would result, then a sub-optimal encoding can be used (i.e., rather than the predicted value) to reign in the gain. The error associated with the subsequent value is less than that due to gain instability. That is, a less-than-best-fit can be chosen in order to get a better fit in the future.

Additionally, the use of future signal characteristics allows foresight in encoding of future changes in gain or frequency. For instance, the error in using a sub-optimal value for the present encoding, may be recovered by using a more optimal gain for several subsequent encodings. Moreover, the use of early gain slough, made possible by evaluation of future signal characteristics, allows some degree of compensation for current errant predictions of curves.

Figure 7:
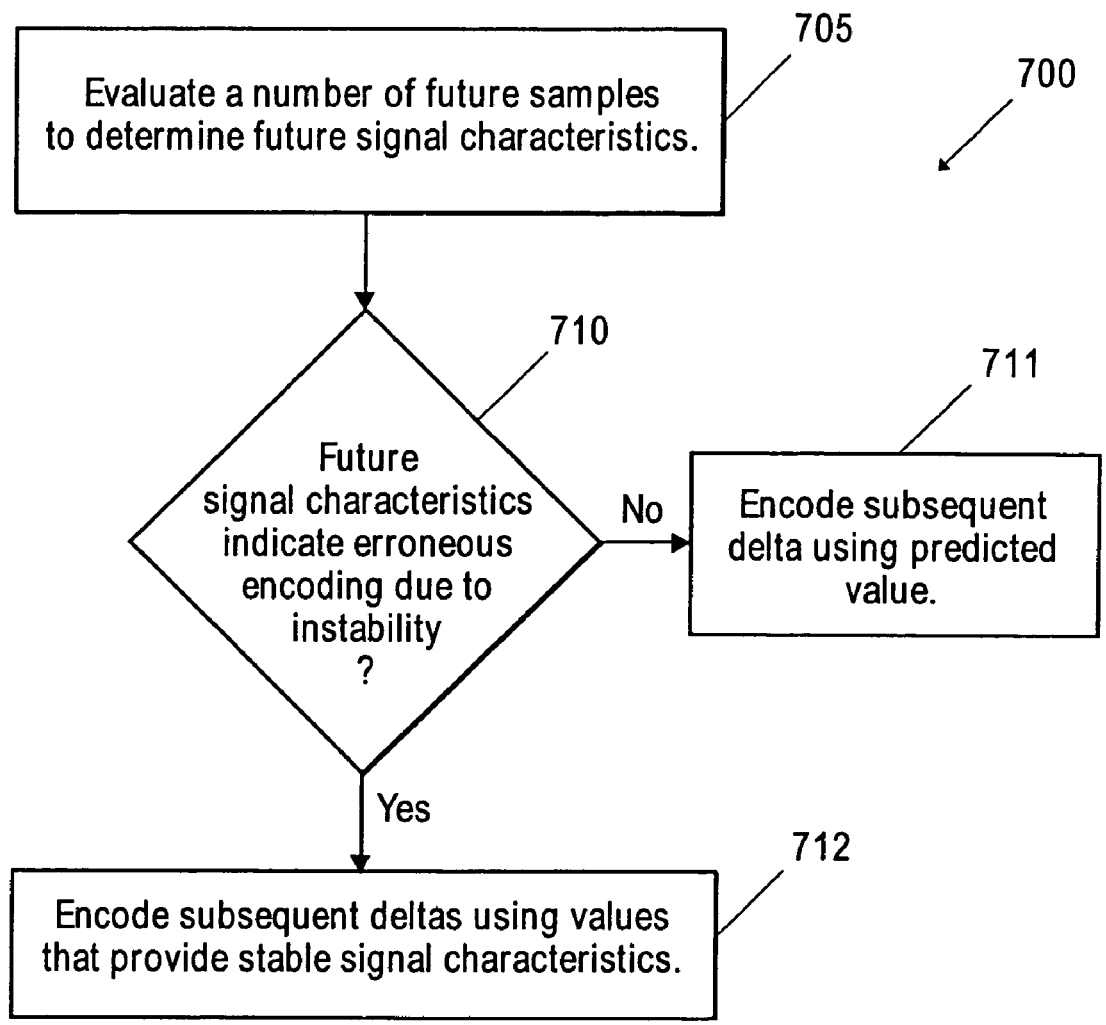
FIG. 7 illustrates a method by which future signal characteristics are used to determine an ADPCM encoding in accordance with one embodiment of the invention.

FIG. 7 illustrates a method by which future signal characteristics are used to determine an ADPCM encoding in accordance with one embodiment of the invention. Process 700, shown in FIG. 7, begins at operation 705 in which a number of future samples are evaluated to determine future signal characteristics. For one embodiment, the number of future samples evaluated is seven.

At operation 710, a determination is made as to whether the future signal characteristics indicate erroneous encoding due to instability.

If the future signal characteristics do not indicate erroneous encoding due to instability, then the subsequent delta value is encoded using the predicted value at operation 711.

If the future signal characteristics indicate erroneous encoding due to instability, then one or more subsequent deltas are encoded using values that stablilize signal characteristics (i.e., that return the system to stability) at operation 712.

Also, the error terms can be weighted by the ability of the human ear to hear them, including, but not limited to reducing the weight for errors during or immediately following large signals, and errors during noise bursts.

Allowing value wrapping (the maximum positive value incrementing to the maximum negative value) reduces calculation and increases quality in some cases when coefficient stability is also used.

Pattern Recognition

There are many common and repeated patterns in audio data, and especially so in regard to human speech. Such common patterns are likewise evident in ADPCM deltas. Often, these common patterns (e.g., common curves of the signal) are small signals. In accordance with one embodiment of the invention, audio data compression is increased by recognizing such common patterns and encoding them in a more efficient manner.

For one embodiment of the invention, recognized common patterns are extracted and compressed in such a manner as to allow the next most common signals to be more easily identified.

Common Patterns

One embodiment of the invention includes recognizing common patterns that can be alternatively encoded to increase compression. Many such patterns exist. For example, a string of zero value ADPCM deltas is a common occurrence representing silence. This is a common pattern because speech is typically represented by signal bursts followed by some period of silence or very low signals. The compression of a string of zeros is typically adjacent to a small step, which is another common pattern. A small step is a small value (positive or negative) followed by a string of zeros (e.g., 1000000). The compression of a small step is typically adjacent to an elementary curve (common curve). An embodiment of the invention includes the process of identifying such common patterns or elementary curves and predicting probable subsequent signal behavior. Many such elementary curves are discernible. The source code included as Appendix A contains 64 of the most common elementary curves, as empirically determined, encoded as a macro.

Once the repetitive zeros, small step followed by zeros, or other common curve is identified it can be encoded using an alternative to ADPCM encoding to provide greater compression. For example, a string of zeros may be encoded using run-length encoding or similar data compression schemes. That is, upon determination of a recognized pattern, the ADPCM encoding is suspended for the duration of the pattern and the deltas constituting the curve are encoded using an alternative encoding scheme. For example, a series of running ADPCM zero value deltas is identified and encoded using a typical data compression scheme, such as run-length encoding.

The number of deltas that constitute the pattern must be a minimum threshold value in order for alternative encoding to provide increased compression. That is, in order to increase compression, the number of bits used to indicate and describe the pattern must be less than the number of bits required for encoding the pattern using ADPCM. For one embodiment, the threshold for a string of zeroes and small steps is three deltas, and for elementary curves five deltas.

Figure 8:
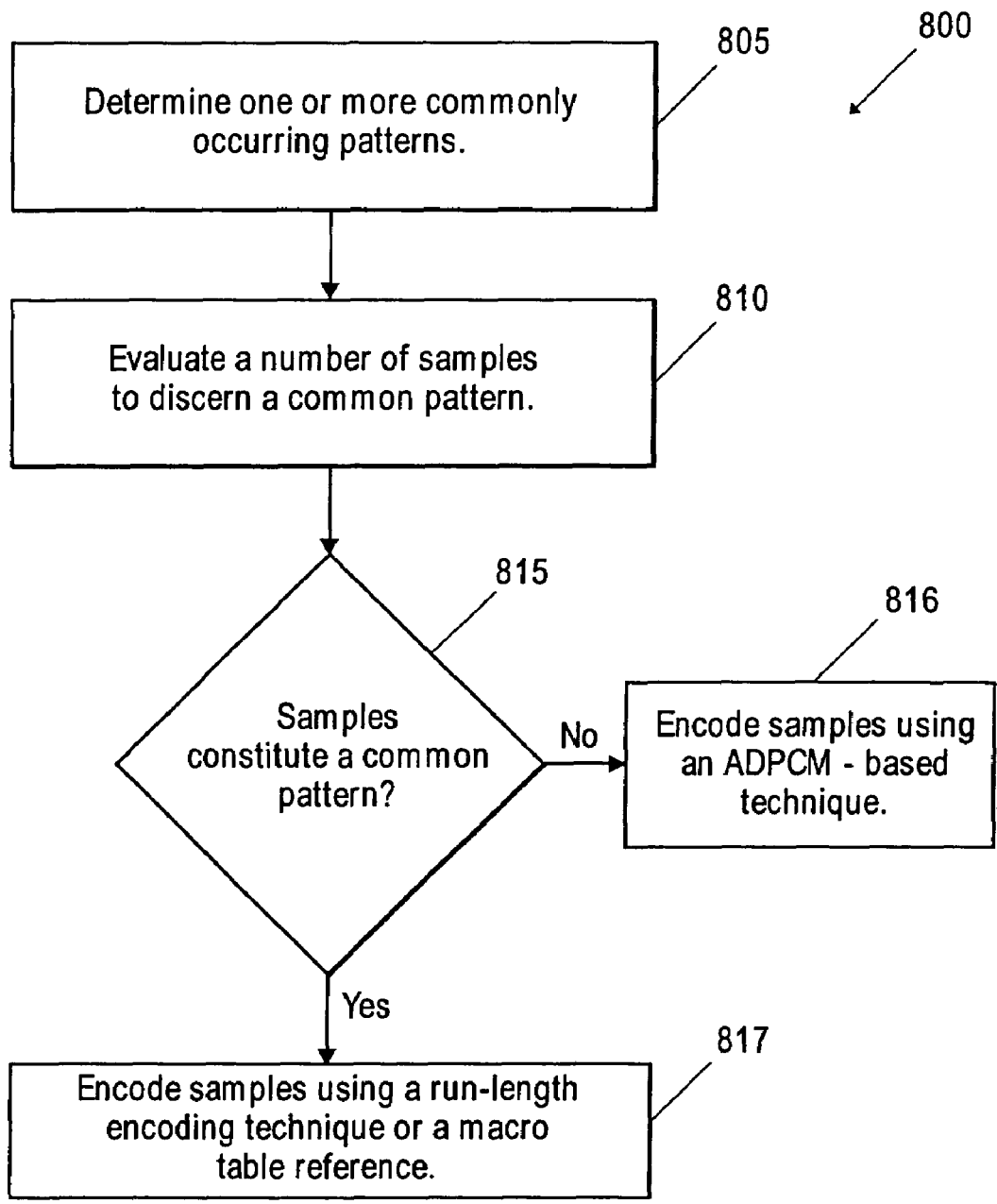
FIG. 8 illustrates a process by which common elementary curves can be detected and compressed in accordance with one embodiment of the invention.

FIG. 8 illustrates a process by which a common pattern is determined and encoded using an alternative encoding scheme in accordance with one embodiment of the invention. Process 800, shown in FIG. 8, begins at operation 805 in which one or more common patterns are determined.

At operation 810, a number of delta values are evaluated in an attempt to discern a common pattern. For one embodiment, the number of delta values evaluated is five.

At operation 815, a determination is made as to whether the delta values constitute a particular common pattern.

If the delta values do not constitute a common pattern, then the delta values are encoded using an ADPCM-based encoding scheme in accordance with various embodiments of the invention at operation 816.

If the delta values do constitute a common pattern, then, at operation 817, the delta values are encoded using a data compression scheme suitable for such values and which provides greater compression than ADPCM encoding. For example, the delta values may be encoded using run-length encoding or similar data compression techniques. In another example, the delta values may be encoded using a macro table lookup.

Post Pattern Gain Reset

For one embodiment of the invention, after a common pattern has been encoded, the gain is reset to a specified sign. For example, the sign of the ADPCM is managed specially so that, following a small step, the elementary curves will be seen with the same sign. This is done because it is expected that, for a small step increase, for example, the elementary curve will increase as well. Moreover, resetting the gain after such a pattern avoids repetitive inversion of the gain due to the multiple zero value deltas. The predictable sign allows a more effective detection of subsequent elementary curves.

Pattern Indication

For one embodiment of the invention in which a 3-bit encoding scheme is implemented, each 16-bit word contains five deltas encoded as 3-bit values, thus, leaving the most significant bit of the 16-bit word available. This initial bit is used to flag a recognized pattern. For one embodiment, one bit is used to indicate the presence of a pattern, and one or more additional bits are used to identify the pattern among a number of patterns (e.g., identify the macro corresponding to the particular pattern).

System

Figure 9:
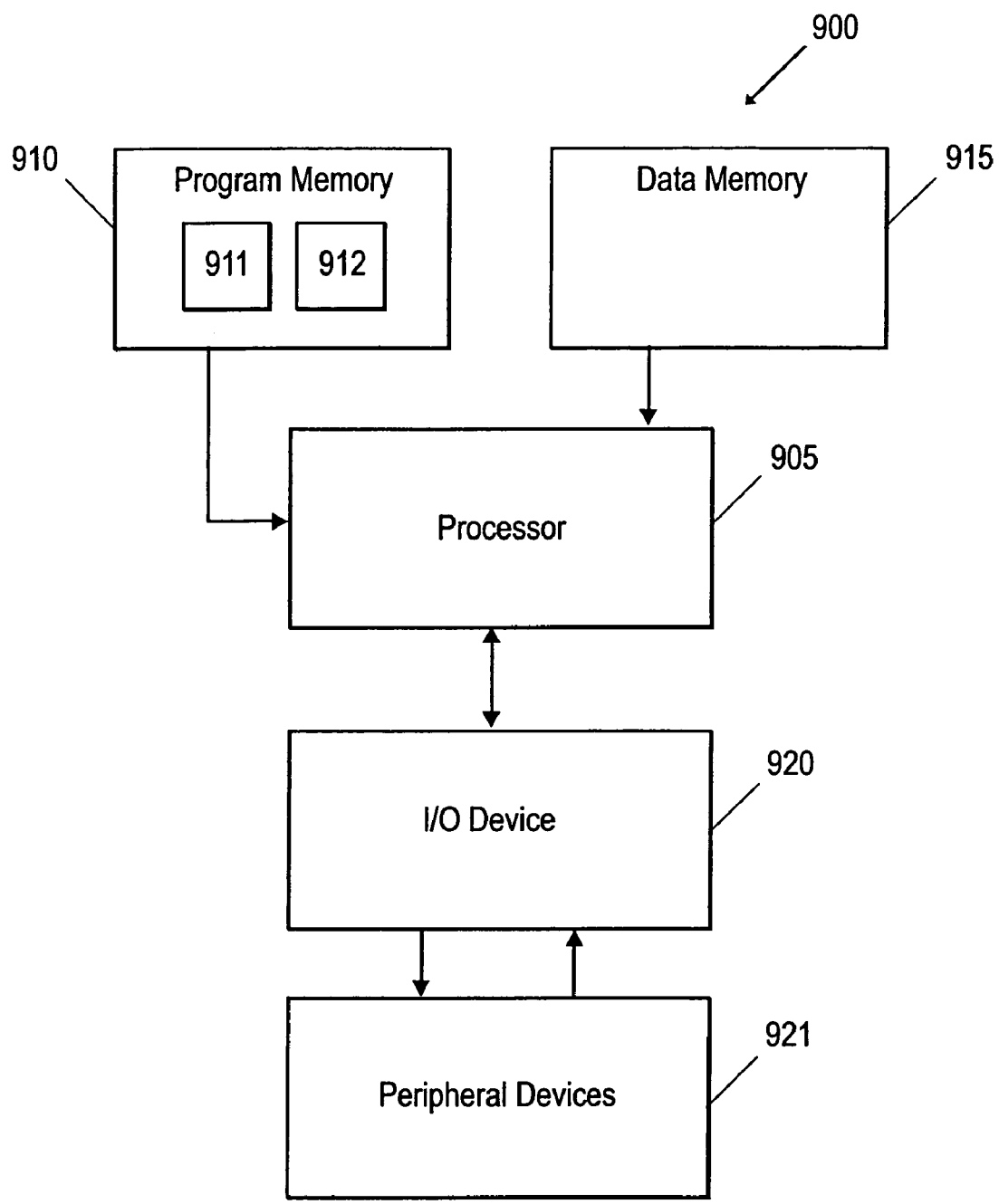
FIG. 9 illustrates a microcontroller for storing compressed audio data in accordance with one embodiment of the present invention.

FIG. 9 illustrates a microcontroller for storing compressed audio data in accordance with one embodiment of the present invention. Microcontroller 900, shown in FIG. 9, includes a microprocessor 905 coupled thereto a program memory 910 and a data memory 915. Program memory 910, which may be, for example, a ROM or EPROM, stores the audio data compression function 911, as well as the compressed audio data 912. Embodiments of the invention provide more effective audio data compression, and therefore, allow for longer duration sound tracks to be stored on a ROM of a particular size. Data memory 915, which may be, for example RAM or SRAM, is used for the calculations associated with the audio data compression in accordance with various embodiments of the invention. Microprocessor 905 is also coupled to I/O device 920 to communicate data between peripheral devices 921. Microprocessor 905 is typically implemented on a single integrated circuit chip, but may also incorporate one or more of the other elements on the same chip.

General Matters

Embodiments of the invention have been described in the context of a 3-bit ADPCM audio data compression scheme. For such a system, embodiments of the invention may be used to provide an increased variable rate of compression (e.g., approximately 3:1), an increased fixed rate of compression (e.g., approximately 2.7:1), and an equal rate of compression (e.g., 2:1), but having much higher quality relative to typical prior art schemes. Other embodiments may be implemented in various other contexts including audio and other non-audio data compression techniques other than ADPCM, as well as encoding, using more or less bits. Several exemplary alternative methods are discussed below.

Alternative Methods

The following is a list of some of the alternative embodiments of the invention. This list is not intended to be exhaustive.

For one embodiment of the invention, the actual values of the signal may be pattern encoded instead of the ADPCM values. This may be less efficient, as matching at different gains gives more opportunities to match.

For one embodiment of the invention, slow moving signals may be encoded as an inflection point and a relative maximum. Such encoding may increase the noise distortion beyond acceptable limits.

For one embodiment of the invention, coding the second derivative of the signal is lossless, as the original signal can easily be reconstructed, and there are typically great spans where the second derivative varies by only four or so counts. For such an embodiment, the second derivative may not be compressed in a lossy manner, as each single-bit error would be amplified greatly.

For one embodiment of the invention, the amplitude of the second derivative can be reduced slightly by adding a portion of the original signal (generally out of phase).

For one embodiment of the invention, the original signal can be preprocessed to stifle near silent passages into zero values. For one such embodiment, the compression achieved is greater, but with a potential for loss of significant signals.

For one embodiment of the invention, the signal may be preprocessed to make it more efficient to process (e.g. flatten flat spots).

For one embodiment of the invention, seven small values that fit into two bits each can be coded into a single word, including some flag bits. However, this is seen to duplicate the effort of the elementary curve detection.

For one embodiment of the invention, step curves can alternately be detected as a series of zero deltas followed by a single step. This form is less likely to occur following a series of zeroes and is less efficient to decompress.

For one embodiment of the invention, frequency can alternately be detected by counting attributes other than zero crossings. Such attributes include, but are not limited to, changes of sign, changes in slope, and flat portions of the incoming curve.

Embodiments of the invention include various operations. Many of the methods are described in their most basic form, but operations can be added to or deleted from any of the methods without departing from the basic scope of the invention.

It will be apparent to those skilled in the art that the operations of the invention may be performed by hardware components or may be embodied in machine-executable instructions, which may be used to cause a general-purpose or special-purpose processor or logic circuits programmed with the instructions to perform the operations. Alternatively, the steps may be performed by a combination of hardware and software. Various embodiments of the invention may be provided as a computer program product that may include a machine-readable medium having stored thereon instructions, which may be used to program a computer (or other electronic devices) to perform a process according to various alternative embodiments of the invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, embodiments of the invention may also be downloaded as a computer program product, wherein the program may be transferred from a remote computer to a requesting computer by way of data signals embodied in a carrier wave or other propagation medium via a communication cell (e.g., a modem or network connection).

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A computer-implemented method comprising:
    compressing audio signal data received, including
        predicting a sign of an adaptive differential pulse code modulation (ADPCM) delta value between a first sample of a signal and a second sample of the signal immediately subsequent to the first sample,
        predicting a future frequency of the signal, and
        skewing an ADPCM encoding scheme based upon the predicted sign of the ADPCM delta value, wherein the ADPCM encoding scheme is skewed with an asymmetry based upon the predicted frequency of the signal; and
    storing the compressed audio signal data in a memory.

2. The method of claim 1, wherein the compressing further comprises:
    encoding the ADPCM delta value using the skewed ADPCM encoding scheme.

3. The method of claim 2 wherein the ADPCM encoding scheme is a three-bit encoding scheme skewed to provide four positive resolution levels, a zero level, and three negative resolution levels, and wherein the encoding is effected using the four positive resolution levels.

4. The method of claim 2 wherein the ADPCM encoding scheme is a three-bit encoding scheme skewed to provide five positive resolution levels, a zero level, and two negative resolution levels, and wherein the encoding is effected using the five positive resolution levels.

5. The method of claim 1 wherein the sign of the ADPCM delta value is predicted based upon a sign of one or more preceding delta values.

6. The method of claim 1 wherein the predicted frequency of the signal is determined by evaluating one or more characteristics of the signal.

7. The method of claim 6 wherein the one or more characteristics of the signal evaluated are selected from a group consisting of signal zero crossings, signal sign changes, signal slope changes, signal values, and combinations thereof.

8. A physical computer readable storage medium having stored thereon a set of instructions which when executed cause a system to perform a method comprising:
    compressing audio signal data received, including
    predicting a sign of an adaptive differential pulse code modulation (ADPCM) delta value between a first sample of a signal and a second sample of the signal immediately subsequent to the first sample,
    predicting a future frequency of the signal, and
    skewing an ADPCM encoding scheme based upon the predicted sign of the ADPCM delta value, wherein the ADPCM encoding scheme is skewed with an asymmetry based upon the predicted frequency of the signal; and
    storing the compressed audio signal data in a memory.

9. The physical computer readable storage medium of claim 8 further comprising:
    encoding the ADPCM delta value using the skewed ADPCM encoding scheme.

10. The physical computer readable storage medium of claim 9 wherein the ADPCM encoding scheme is a three-bit encoding scheme skewed to provide four positive resolution levels, a zero level, and three negative resolution levels, and wherein the encoding is effected using the four positive resolution levels.

11. The physical computer readable storage medium of claim 9 wherein the ADPCM encoding scheme is a three-bit encoding scheme skewed to provide five positive resolution levels, a zero level, and two negative resolution levels, and wherein the encoding is effected using the five positive resolution levels.

12. The physical computer readable storage medium of claim 8 wherein the sign of the ADPCM delta value is predicted based upon a sign of one or more preceding delta values.

13. The physical computer readable storage medium of claim 8 wherein the predicted frequency of the signal is determined based upon one or more signal characteristics.

14. The physical computer readable storage medium of claim 13 wherein the one or more characteristics of the signal evaluated are selected from a group consisting of signal zero crossings, signal sign changes, signal slope changes, signal values, and combinations thereof.

15. A system comprising:
    a processor; and
    a memory coupled to the processor, the memory having stored thereon one or more executable instructions, which when executed by the processor cause the processor to perform a method comprising:
    compressing audio signal data received, including
        predicting a sign of an adaptive differential pulse code modulation (ADPCM) delta value between a first sample of a signal and a second sample of the signal immediately subsequent to the first sample,
        predicting a future frequency of the signal, and
        skewing an ADPCM encoding scheme based upon the predicted sign of the ADPCM delta value, wherein the ADPCM encoding scheme is skewed with an asymmetry based upon the predicted frequency of the signal; and
    storing the compressed audio signal data in the memory.

16. The system of claim 15 wherein the method further comprises:
    encoding the ADPCM delta value using the skewed ADPCM encoding scheme.

17. The system of claim 16 wherein the ADPCM encoding scheme is a three-bit encoding scheme skewed to provide four positive resolution levels, a zero level, and three negative resolution levels, and wherein the encoding is effected using the four positive resolution levels.

18. The system of claim 16 wherein the ADPCM encoding scheme is a three-bit encoding scheme skewed to provide five positive resolution levels, a zero level, and two negative resolution levels, and wherein the encoding is effected using the five positive resolution levels.

19. The system of claim 15 wherein the sign of the ADPCM delta value is predicted based upon a sign of one or more preceding delta values.

20. The system of claim 15 wherein the predicted frequency of the signal is determined based upon one or more signal characteristics.

21. The system of claim 20 wherein the one or more characteristics of the signal evaluated are selected from a group consisting of signal zero crossings, signal sign changes, signal slope changes, signal values, and combinations thereof.

* * * * *